United States Patent
Funakoshi

(10) Patent No.: US 9,214,430 B2
(45) Date of Patent: Dec. 15, 2015

(54) SEMICONDUCTOR DEVICE AND METHOD FOR MANUFACTURING SEMICONDUCTOR DEVICE

(71) Applicant: Yasushi Funakoshi, Osaka (JP)

(72) Inventor: Yasushi Funakoshi, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/357,649

(22) PCT Filed: Nov. 7, 2012

(86) PCT No.: PCT/JP2012/078816
§ 371 (c)(1),
(2) Date: May 12, 2014

(87) PCT Pub. No.: WO2013/069672
PCT Pub. Date: May 16, 2013

(65) Prior Publication Data
US 2014/0339682 A1    Nov. 20, 2014

(30) Foreign Application Priority Data

Nov. 11, 2011   (JP) .................................. 2011-247307

(51) Int. Cl.
*H01L 21/00*   (2006.01)
*H01L 31/00*   (2006.01)
*H01L 23/544*  (2006.01)
(Continued)

(52) U.S. Cl.
CPC .......... *H01L 23/544* (2013.01); *B24B 27/0633* (2013.01); *B28D 5/045* (2013.01); *H01L 21/2251* (2013.01); *H01L 21/2254* (2013.01); *H01L 21/304* (2013.01); *H01L 21/78* (2013.01); *H01L 29/0657* (2013.01); *H01L 29/34* (2013.01); *H01L 29/36* (2013.01); *H01L 31/022441* (2013.01); *H01L 31/0682* (2013.01); *H01L 31/18* (2013.01); *H01L 31/1804* (2013.01); *H01L 2223/54473* (2013.01); *H01L 2924/0002* (2013.01); *Y02E 10/547* (2013.01)

(58) Field of Classification Search
CPC .............. H01L 23/544; H01L 21/2251; H01L 21/2254; H01L 21/78; H01L 31/022441; H01L 31/0682; H01L 31/18; H01L 31/1804; H01L 29/0657; H01L 29/34; H01L 29/36
See application file for complete search history.

(56) References Cited

U.S. PATENT DOCUMENTS

2011/0300697 A1* 12/2011 Kohira et al. ................. 438/546
2013/0069209 A1   3/2013 Fujita et al.

FOREIGN PATENT DOCUMENTS

JP    2006-156646      6/2006
WO   WO 2011/145521   11/2011

OTHER PUBLICATIONS

International Search Report for PCT/JP2012/078816 mailed Feb. 5, 2013.

*Primary Examiner* — Colleen A Matthews
*Assistant Examiner* — Quovaunda V Jefferson
(74) *Attorney, Agent, or Firm* — Nixon & Vanderhye, P.C.

(57) ABSTRACT

Provided are a semiconductor device in which abrasive grain marks are formed in a surface of a semiconductor substrate, a dopant diffusion region has a portion extending in a direction which forms an angle included in a range of −5° to +5° with a direction in which the abrasive grain marks extend, and the dopant diffusion region is formed by diffusing a dopant from a doping paste placed on one surface of the semiconductor substrate; and a method for manufacturing the semiconductor device.

5 Claims, 14 Drawing Sheets

(51) Int. Cl.
*H01L 31/18* (2006.01)
*H01L 21/225* (2006.01)
*H01L 29/06* (2006.01)
*H01L 21/78* (2006.01)
*H01L 29/34* (2006.01)
*H01L 29/36* (2006.01)
*H01L 31/0224* (2006.01)
*H01L 31/068* (2012.01)
*B24B 27/06* (2006.01)
*B28D 5/04* (2006.01)
*H01L 21/304* (2006.01)

(a)

(b)

(a)

(b)

(a)

(b)

(a)

(b)

(a)

(b)

(a)

(b)

(a)

(b)

(a)

(b)

(a)

(b)

(c)

(d)

(e)

(f)

(g)

(h)

(i)

SEMICONDUCTOR DEVICE AND METHOD FOR MANUFACTURING SEMICONDUCTOR DEVICE

This application is the U.S. national phase of International Application No. PCT/JP2012/078816 filed 7 Nov. 2012 which designated the U.S. and claims priority to JP 2011-247307 filed 11 Nov. 2011, the entire contents of each of which are hereby incorporated by reference.

TECHNICAL FIELD

The present invention relates to a semiconductor device and a method for manufacturing a semiconductor device.

BACKGROUND ART

In recent years, development of clean energy has been desired due to the problem of exhaustion of energy resources, global environmental problems such as an increase in $CO_2$ in the atmosphere, and the like, and photovoltaic power generation using solar cells in particular among semiconductor devices has been developed, put to practical use, and is progressing as a new energy source.

As a solar cell, a bifacial electrode type solar cell has been conventionally a mainstream, in which a p-n junction is formed for example by diffusing an impurity having a conductivity type opposite to that of a single crystal or polycrystalline silicon substrate, into a light receiving surface of the silicon substrate, and electrodes are respectively formed on the light receiving surface and a back surface opposite to the light receiving surface of the silicon substrate. Further, in the bifacial electrode type solar cell, it is also common to achieve higher output using a back surface field effect, by diffusing a high concentration of an impurity having the same conductivity type as that of the silicon substrate into the back surface of the silicon substrate.

In addition, research and development have also been made for a back electrode type solar cell in which no electrode is formed on a light receiving surface of a silicon substrate and electrodes are formed only on a back surface of the silicon substrate (see, for example, PTD 1 (Japanese Patent Laying-Open No. 2006-156646) and the like).

Hereinafter, one example of a method for manufacturing a conventional back electrode type solar cell will be described with reference to the schematic cross sectional views of FIGS. 30(a) to 30(i).

First, as shown in FIG. 30(a), an n-type doping paste 103 is applied on a back surface of a silicon substrate 101 having an n-type or p-type conductivity type, and dried. N-type doping paste 103 is pattern-applied to follow the desired shape of an n-type dopant diffusion region.

Here, as silicon substrate 101, for example, a silicon substrate obtained by slicing a silicon ingot can be used. Further, as silicon substrate 101, it is desirable to use a silicon substrate from which a slice damage layer caused by slicing has been removed. It is noted that the slice damage layer can be removed, for example, by etching with a mixed acid of an aqueous solution of hydrogen fluoride and nitric acid.

It is noted that the surface having n-type doping paste 103 applied thereon is described here as the back surface of silicon substrate 101, and the other surface of silicon substrate 101 serves as a light receiving surface of the solar cell. Hereinafter, the light receiving surface may be referred to as a front surface.

Next, as shown in FIG. 30(b), an n-type dopant is diffused from n-type doping paste 103 into semiconductor substrate 101 to form an n-type dopant diffusion region 113. Thereafter, a residue of n-type doping paste 103 on the back surface of silicon substrate 101 is removed with an aqueous solution of hydrogen fluoride.

Next, as shown in FIG. 30(c), a p-type doping paste 104 is pattern-applied on the back surface of silicon substrate 101 to follow the desired shape of a p-type dopant diffusion region, and dried.

Next, as shown in FIG. 30(d), a p-type dopant is diffused from p-type doping paste 104 into silicon substrate 101 to form a p-type dopant diffusion region 114, and a residue of p-type doping paste 104 is removed with an aqueous solution of hydrogen fluoride.

Next, as shown in FIG. 30(e), a silicon oxide film 105 is formed on the back surface of silicon substrate 101 using a CVD method. On this occasion, a silicon nitride film, or a laminated film of a silicon oxide film and a silicon nitride film may be used instead of silicon oxide film 105.

Next, as shown in FIG. 30(f), a texture structure 110 is formed in the front surface of silicon substrate 101, using for example a mixed acid of an aqueous solution of hydrogen fluoride and nitric acid, or the like. It is noted that, on this occasion, silicon oxide film 105 on the back surface of silicon substrate 101 serves as a protective mask when texture structure 110 is formed, and also serves as a passivation film on the back surface of silicon substrate 101.

Next, as shown in FIG. 30(g), a light receiving surface passivation film 106 is formed on the front surface of silicon substrate 101 using the CVD method. As light receiving surface passivation film 106, a silicon oxide film, a silicon nitride film, or a laminated film of a silicon oxide film and a silicon nitride film may be used. Further, light receiving surface passivation film 106 is a film also serving as a so-called antireflection film.

Next, as shown in FIG. 30(h), portions of silicon oxide film 105 are removed to form contact holes 123, 124 which expose portions of the diffusion regions. To form the contact holes, for example, a known etching paste can be used.

Next, as shown in FIG. 30(i), an electrode for n type 133 electrically connected to n-type dopant diffusion region 113 through contact hole 123 is formed, and an electrode for p type 134 electrically connected to p-type dopant diffusion region 114 through contact hole 124 is formed.

Electrode for n type 133 and electrode for p type 134 can be formed, for example, by printing a known metal paste by a screen printing method and firing the metal paste.

CITATION LIST

Patent Document

PTD 1: Japanese Patent Laying-Open No. 2006-156646

SUMMARY OF INVENTION

Technical Problem

However, the conventional back electrode type solar cell has a problem that n-type dopant diffusion region 113 and p-type dopant diffusion region 114 cannot be formed at predetermined regions, respectively, and good characteristics cannot be obtained stably.

Such a problem occurs not only in the back electrode type solar cell, but also in all semiconductor devices including a solar cell such as a bifacial electrode type solar cell.

In view of the above circumstances, one object of the present invention is to provide a semiconductor device and a method for manufacturing a semiconductor device capable of stably obtaining good characteristics.

Solution to Problem

The present invention is directed to a semiconductor device including a semiconductor substrate, and a dopant diffusion region provided in one surface of the semiconductor substrate, wherein abrasive grain marks are formed in the surface of the semiconductor substrate, the dopant diffusion region has a portion extending in a direction which forms an angle included in a range of −5° to +5° with a direction in which the abrasive grain marks extend, and the dopant diffusion region is formed by diffusing a dopant from a doping paste placed on the one surface of the semiconductor substrate.

Preferably, in the semiconductor device in accordance with the present invention, the dopant diffusion region has at least one of an n-type dopant diffusion region and a p-type dopant diffusion region, and the semiconductor device further includes an electrode for n type provided on the n-type dopant diffusion region, and an electrode for p type provided on the p-type dopant diffusion region.

Further, the present invention is directed to a method for manufacturing a semiconductor device, including the steps of forming abrasive grain marks extending in one direction in a surface of a semiconductor substrate, placing a doping paste having a portion extending in a direction which forms an angle included in a range of −5° to +5° with a direction in which the abrasive grain marks extend, on a portion of the surface of the semiconductor substrate, and forming a dopant diffusion region from a dopant in the doping paste on the semiconductor substrate.

Preferably, in the method for manufacturing a semiconductor device in accordance with the present invention, the step of forming the abrasive grain marks includes the step of cutting a semiconductor crystal ingot with a wire saw.

Further, preferably, the method for manufacturing a semiconductor device in accordance with the present invention includes the step of etching the surface of the semiconductor substrate between the step of forming the abrasive grain marks and the step of placing the doping paste.

Advantageous Effects of Invention

According to the present invention, a semiconductor device and a method for manufacturing a semiconductor device capable of stably obtaining good characteristics can be provided.

DESCRIPTION OF EMBODIMENTS

Figure 1:
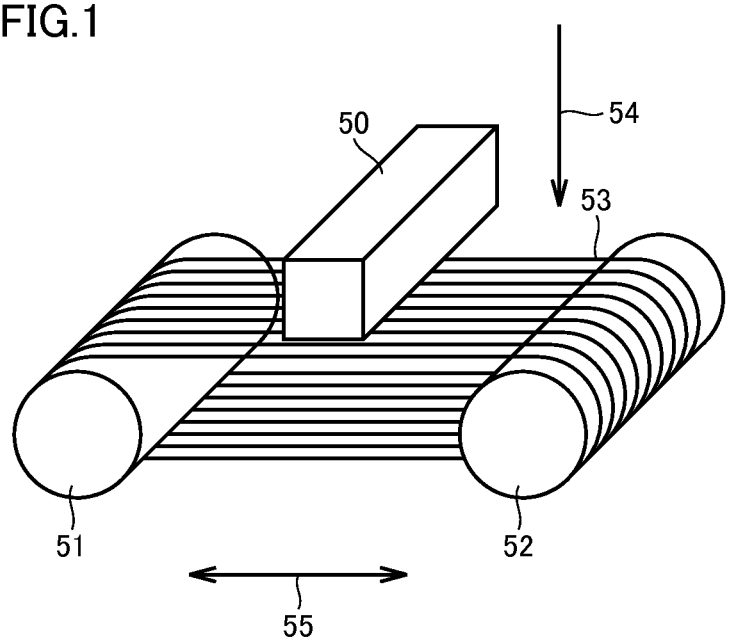
FIG. 1 is a schematic perspective view illustrating one example of the step of cutting a semiconductor crystal ingot with a wire saw.
Figure 2:
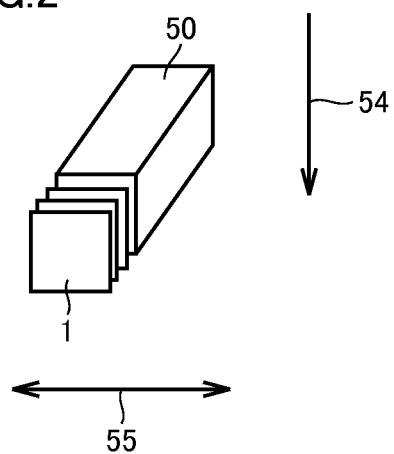
FIG. 2 is a schematic perspective view illustrating one example of the step of cutting the semiconductor crystal ingot at a plurality of positions to cut out a plurality of semiconductor substrates.

Hereinafter, a method for manufacturing a back electrode type solar cell in accordance with an embodiment as one example of a method for manufacturing a semiconductor device in accordance with the present invention will be described with reference to FIGS. 1 to 16. It is noted that, in the drawings of the present invention, the same reference numerals designate identical or corresponding parts.

First, as shown in the schematic perspective view of FIG. 1, the step of cutting a semiconductor crystal ingot 50 with a wire saw 53 is performed. As shown in FIG. 1, wire saw 53 are wound on between guide rollers 51, 52 arranged with a predetermined interval therebetween. As a result, wire saw 53 is tensioned between guide rollers 51, 52, at a plurality of positions in each of guide rollers 51, 52, at predetermined intervals along a longitudinal direction of guide rollers 51, 52. In this state, guide rollers 51, 52 repeat forward rotation and reverse rotation, and thereby wire saw 53 reciprocates in a direction indicated by an arrow 55.

While wire saw 53 is reciprocating in the direction indicated by arrow 55, semiconductor crystal ingot 50 is moved in a direction indicated by an arrow 54, and pressed against reciprocating wire saw 53. Thereby, as shown for example in the schematic perspective view of FIG. 2, semiconductor crystal ingot 50 is cut at a plurality of positions, and a plurality of semiconductor substrates 1 are cut out.

Figure 3:
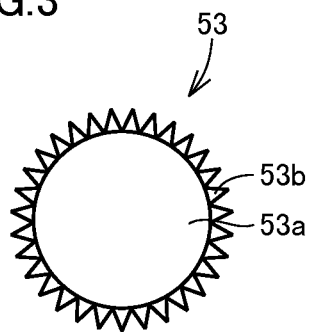
FIG. 3 is a schematic cross sectional view of one example of the wire saw shown in FIG. 1.

FIG. 3 shows a schematic cross sectional view of one example of wire saw 53 shown in FIG. 1. Here, wire saw 53 includes a core wire 53a, and abrasive grains 53b bonded on an outer peripheral surface of core wire 53a with a bond material (not shown). As core wire 53a, for example, a piano wire or the like can be used. As abrasive grains 53b, for example, diamond abrasive grains or the like can be used. As the bond material, for example, nickel or the like plated on the outer surface of core wire 53a can be used.

Figure 4:
FIG. 4 is a schematic cross sectional view of one example of a semiconductor substrate obtained by cutting the semiconductor crystal ingot with the wire saw shown in FIG. 1.

FIG. 4 shows a schematic cross sectional view of one example of semiconductor substrate 1 obtained by cutting semiconductor crystal ingot 50 with wire saw 53. Here, slice damage 1a is caused in surfaces of semiconductor substrate 1 by cutting semiconductor crystal ingot 50 with wire saw 53.

As semiconductor crystal ingot 50, for example, a crystal silicon ingot such as a single crystal silicon ingot or a polycrystalline silicon ingot fabricated by a Czochralski method or a casting method, or the like is used. When a crystal silicon ingot is used as semiconductor crystal ingot 50, a silicon crystal substrate can be obtained as semiconductor substrate 1. It is noted that, in the present embodiment, semiconductor crystal ingot 50 has an n-type conductivity type by being doped with an n-type dopant.

Figure 5:
FIG. 5 is a schematic cross sectional view illustrating one example of the step of removing slice damage in surfaces of the semiconductor substrate shown in FIG. 4.

Next, as shown in the schematic cross sectional view of FIG. 5, the step of removing slice damage 1a in the surfaces of semiconductor substrate 1 shown in FIG. 4 is performed. Here, when a silicon crystal substrate is used as semiconductor substrate 1, slice damage 1a can be removed, for example, by etching with an alkaline aqueous solution such as an aqueous solution of sodium hydroxide or an aqueous solution of potassium hydroxide.

Although the size and shape of semiconductor substrate 1 are not particularly limited, for example, a semiconductor substrate having a thickness of more than or equal to 100 µm and less than or equal to 300 µm, and having a surface in the shape of a rectangle with each side having a length of more than or equal to 100 mm and less than or equal to 200 mm, or the like can be used.

Figure 6:
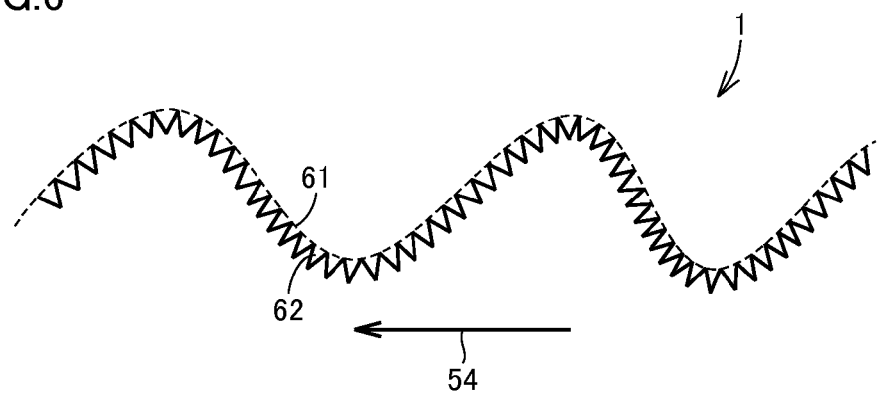
FIG. 6 is an enlarged schematic cross sectional view of one example of a portion of a surface of the semiconductor substrate shown in FIG. 5.
Figure 7:
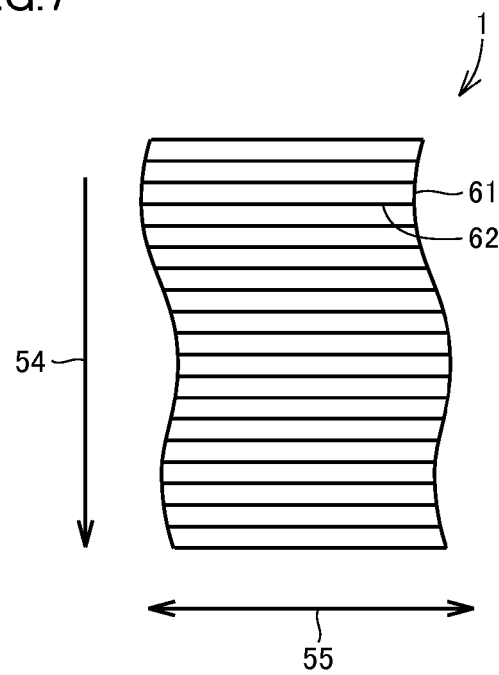
FIG. 7 is a schematic perspective view of one example of a portion of the surface of the semiconductor substrate shown in FIG. 5.

FIG. 6 shows an enlarged schematic cross sectional view of one example of a portion of a surface of semiconductor substrate 1 shown in FIG. 5. FIG. 7 shows a schematic perspective view of one example of a portion of the surface of semiconductor substrate 1 shown in FIG. 5. Here, in the surface of semiconductor substrate 1, a large wave (indicated by an imaginary dash line in FIG. 6; hereinafter referred to as a "saw mark") 61 is formed, and abrasive grain marks 62 in the shape of grooves shallower than saw mark 61 are formed.

Saw mark 61 is formed resulting from cutting of semiconductor crystal ingot 50 with wire saw 53. Specifically, when semiconductor substrate 1 is obtained by pressing semiconductor crystal ingot 50 against reciprocating wire saw 53 and cutting semiconductor crystal ingot 50 as shown in FIG. 1, wire saw 53 is stopped momentarily each time when traveling direction 55 of wire saw 53 is switched, causing a reduction in the wire speed. This leads to different cutting depths into semiconductor crystal ingot 50 with wire saw 53 along the direction in which semiconductor crystal ingot 50 is moved with respect to wire saw 53 (i.e., direction indicated by arrow 54), which appear as saw mark 61 that is a large wave in the surface of semiconductor substrate 1.

In addition, abrasive grain marks 62 are flaws formed by abrasive grains 53*b* of wire saw 53 during cutting of semiconductor crystal ingot 50 with wire saw 53, and are formed in the shape of grooves extending in traveling direction 55 of wire saw 53.

It is noted that, although not shown in FIGS. 6 and 7 for convenience of explanation, crater-like depressions may be formed in the surface of semiconductor substrate 1 by the etching for removing slice damage 1*a* described above.

Figure 8:
FIG. 8(a) is a schematic cross sectional view illustrating one example of the step of placing an n-type doping paste on a back surface of the semiconductor substrate.
FIG. 8(b) is a schematic plan view illustrating one example of the step of placing the n-type doping paste on the back surface of the semiconductor substrate.
Figure 8:
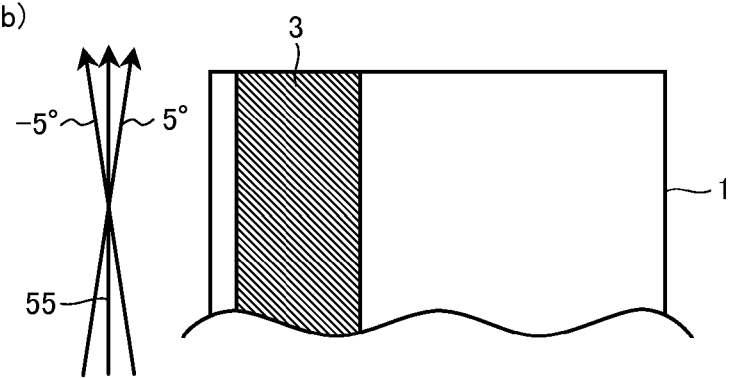

Next, as shown in the schematic cross sectional view of FIG. 8(*a*) and the schematic plan view of FIG. 8(*b*), an n-type doping paste 3 is placed on a portion of a surface on a back side (i.e., back surface) of semiconductor substrate 1.

Here, as shown in the schematic plan view of FIG. 8(*b*), n-type doping paste 3 is placed to have a portion extending in a direction which forms an angle included in a range of −5° to +5° with a direction in which the abrasive grain marks (not shown) extend (i.e., direction indicated by arrow 55). This is based on the findings obtained by the inventor of the present invention through earnest study that, when n-type doping paste 3 is placed to extend in the direction which forms an angle included in the range of −5° to +5° with the direction in which the abrasive grain marks extend, n-type doping paste 3 can be suppressed from flowing out in a direction other than the direction in which it extends, when compared with a case where n-type doping paste 3 is placed to extend in a direction outside the range. Thereby, n-type doping paste 3 can be stably formed, at least in that portion, in the direction which forms an angle included in the range of −5° to +5° with the direction in which the abrasive grain marks extend (i.e., direction indicated by arrow 55). It is noted that, the present embodiment will describe a case where n-type doping paste 3 is formed in the shape of a band extending in a direction which forms an angle of 0° with the direction in which the abrasive grain marks extend (i.e., direction indicated by arrow 55).

As n-type doping paste 3, the one containing an n-type dopant such as a phosphorus compound, and also containing, for example, a solvent, a thickener, and a silicon oxide precursor can be used. Further, as n-type doping paste 3, the one not containing a thickener can also be used.

As the phosphorus compound, for example, a component containing phosphorus atoms such as phosphate, phosphorus oxide, phosphorus pentaoxide, phosphoric acid, or an organic phosphorus compound can be used alone or in combination of two or more kinds thereof.

Examples of the solvent include ethylene glycol, methyl cellosolve, methyl cellosolve acetate, ethyl cellosolve, diethyl cellosolve, cellosolve acetate, ethylene glycol monophenyl ether, methoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methylethyl ether, diethylene glycol diethyl ether, diethylene glycol acetate, triethylglycol, triethylene glycol monomethyl ether, triethylene glycol monoethyl ether, tetraethylene glycol, liquid polyethylene glycol, propylene glycol, propylene glycol monomethyl ether, propylene glycol monoethyl ether, propylene glycol monobutyl ether, 1-butoxyethoxy propanol, dipropyl glycol, dipropylene glycol monomethyl ether, dipropylene glycol monoethyl ether, tripropylene glycol monomethyl ether, polypropylene glycol, trimethylene glycol, butanedial, 1,5-pentanedial, hexylene glycol, glycerin, glyceryl acetate, glycerin diacetate, glyceryl triacetate, trimethylolpropine, 1,2,6-hexane triol, 1,2-propanediol, 1,5-pentanedial, octanediol, 1,2-butanediol, 1,4-butanediol, 1,3-butanediol, dioxane, trioxane, tetrahydrofuran, tetrahydropyran, methylal, diethyl acetal, methyl ethyl ketone, methyl isobutyl ketone, diethyl ketone, acetonylacetone, diacetone alcohol, methyl formate, ethyl formate, propyl formate, methyl acetate, and ethyl acetate, which can be used alone or in combination of two or more kinds thereof.

As the thickener, although it is desirable to use ethyl cellulose, polyvinyl pyrrolidone, or a mixture thereof, it is also possible to use bentonite having various qualities and characteristics, a generally inorganic rheology additive for various polar solvent mixtures, nitrocellulose and other cellulose compounds, starch, gelatin, alginic acid, highly-dispersive amorphous silicic acid (Aerosil (registered trademark)), polyvinyl butyral (Mowital (registered trademark)), sodium carboxymethyl cellulose (vivistar), thermoplastic polyimide resin (Eurelon (registered trademark)), an organic castor oil derivative (Thixin R (registered trademark)), diamide wax (Thixatrol plus (registered trademark)), swelable polyacrylate (Rheolate (registered trademark)), polyether urea-polyurethane, polyether-polyol, or the like.

As the silicon oxide precursor, for example, a substance represented by a general formula $R^{1\prime}{}_n Si(OR^1)_{4-n}$, (where $R^{1\prime}$ represents methyl, ethyl, or phenyl, $R^1$ represents methyl, ethyl, n-propyl, or i-propyl, and n represents 0, 1, or 2) such as TEOS (tetraethyl orthosilicate) can be used.

N-type doping paste 3 can be placed, for example, using a conventionally known technique such as screen printing, inkjet printing, or the like.

Thereafter, n-type doping paste 3 placed on the back surface of semiconductor substrate 1 is dried.

N-type doping paste 3 can be dried, for example, by placing semiconductor substrate 1 having the paste placed thereon inside an oven, and heating the paste at a temperature of, for example, about 200° C. for a period of, for example, several tens of minutes.

Figure 9:
FIG. 9(a) is a schematic cross sectional view illustrating one example of the step of forming an n-type dopant diffusion region in the back surface of the semiconductor substrate.
FIG. 9(b) is a schematic plan view illustrating one example of the step of forming the n-type dopant diffusion region in the back surface of the semiconductor substrate.
Figure 9:
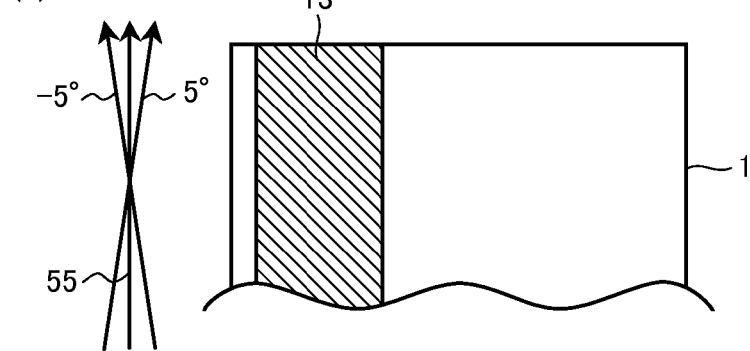

Next, as shown in the schematic cross sectional view of FIG. 9(*a*) and the schematic plan view of FIG. 9(*b*), semiconductor substrate 1 is put into a quartz furnace at more than or equal to 800° C. and less than or equal to 1100° C. to diffuse the n-type dopant from n-type doping paste 3 into the back surface of semiconductor substrate 1, to form an n-type dopant diffusion region 13. Thereby, as shown in the schematic plan view of FIG. 9(*b*), n-type dopant diffusion region 13 is formed in the shape of a band extending in a direction which forms an angle included in the range of −5° to +5° with the direction in which the abrasive grain marks extend (i.e., direction indicated by arrow 55). It is noted that n-type dopant diffusion region 13 is a region having an n-type dopant concentration higher than that in semiconductor substrate 1.

Thereafter, a residue of n-type doping paste 3 on the back surface of silicon substrate 1 is removed. The residue of n-type doping paste 3 can be removed, for example, by immersing semiconductor substrate 1 having n-type doping paste 3 placed thereon in an aqueous solution of hydrofluoric acid, or the like.

Figure 10:
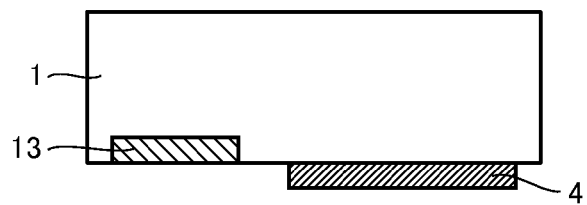
FIG. 10(a) is a schematic cross sectional view illustrating one example of the step of placing a p-type doping paste on the back surface of the semiconductor substrate.
FIG. 10(b) is a schematic plan view illustrating one example of the step of placing the p-type doping paste on the back surface of the semiconductor substrate.
Figure 10:
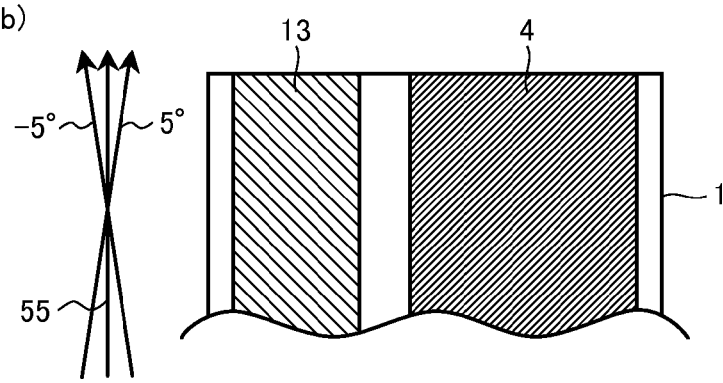
Figure 11:
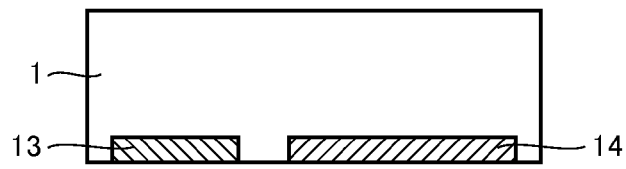
FIG. 11(a) is a schematic cross sectional view illustrating one example of the step of forming a p-type dopant diffusion region in the back surface of the semiconductor substrate.
FIG. 11(b) is a schematic plan view illustrating one example of the step of forming the p-type dopant diffusion region in the back surface of the semiconductor substrate.
Figure 11:
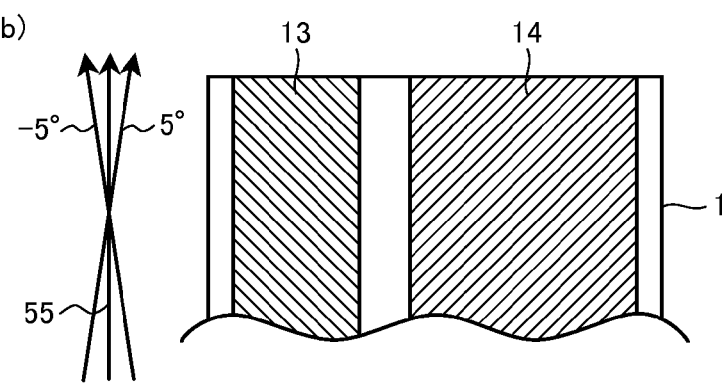
Figure 12:
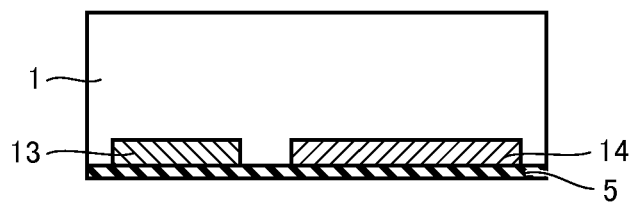
FIG. 12(a) is a schematic cross sectional view illustrating one example of the step of forming a passivation film on the back surface of the semiconductor substrate.
FIG. 12(b) is a schematic plan view illustrating one example of the step of forming the passivation film on the back surface of the semiconductor substrate.
Figure 12:
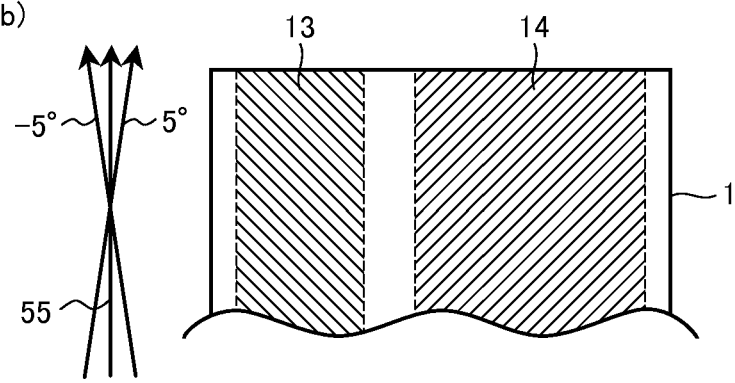
Figure 13:
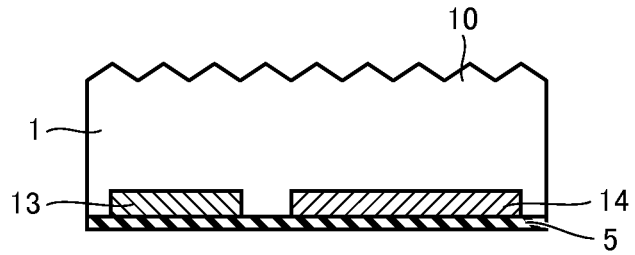
FIG. 13(a) is a schematic cross sectional view illustrating one example of the step of forming a texture structure in a front surface of the semiconductor substrate.
FIG. 13(b) is a schematic plan view illustrating one example of the step of forming the texture structure in the front surface of the semiconductor substrate.
Figure 13:
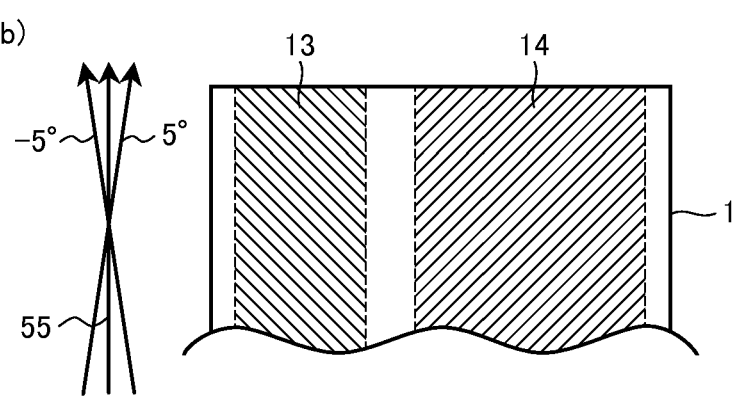
Figure 14:
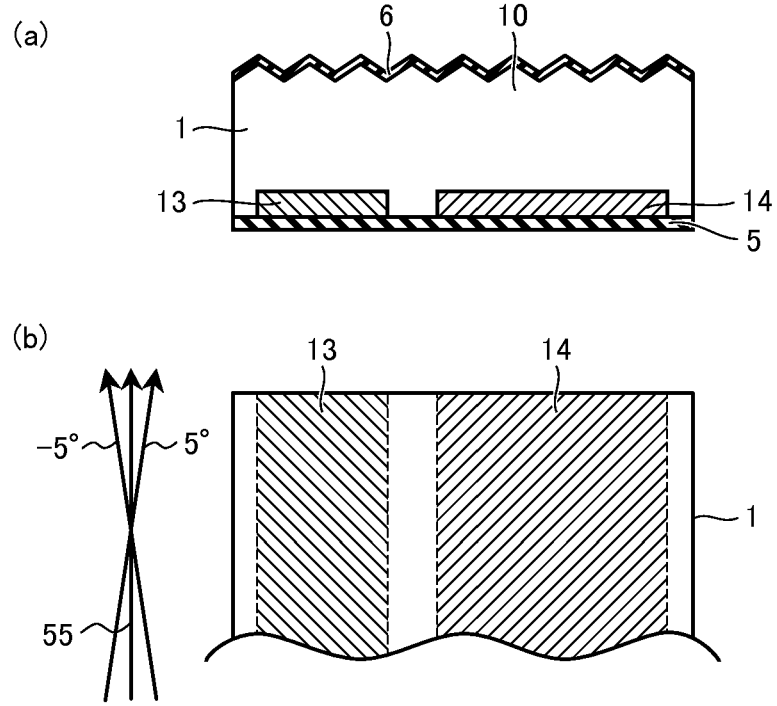
FIG. 14(a) is a schematic cross sectional view illustrating one example of the step of forming a passivation film on the front surface of the semiconductor substrate.
FIG. 14(b) is a schematic plan view illustrating one example of the step of forming the passivation film on the front surface of the semiconductor substrate.
Figure 15:
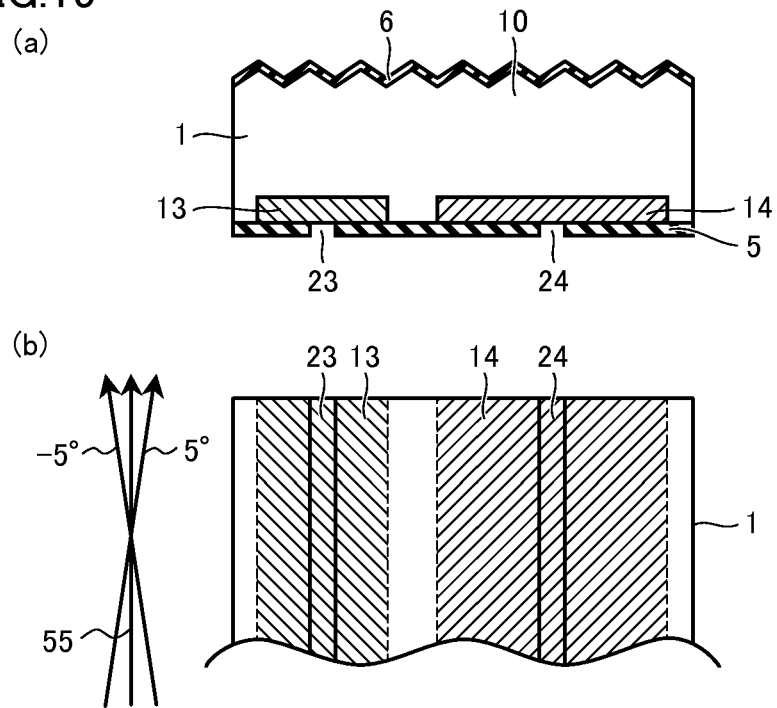
FIG. 15(a) is a schematic cross sectional view illustrating one example of the step of forming contact holes by removing portions of the passivation film on the back surface of the semiconductor substrate.
FIG. 15(b) is a schematic plan view illustrating one example of the step of forming the contact holes by removing portions of the passivation film on the back surface of the semiconductor substrate.
Figure 16:
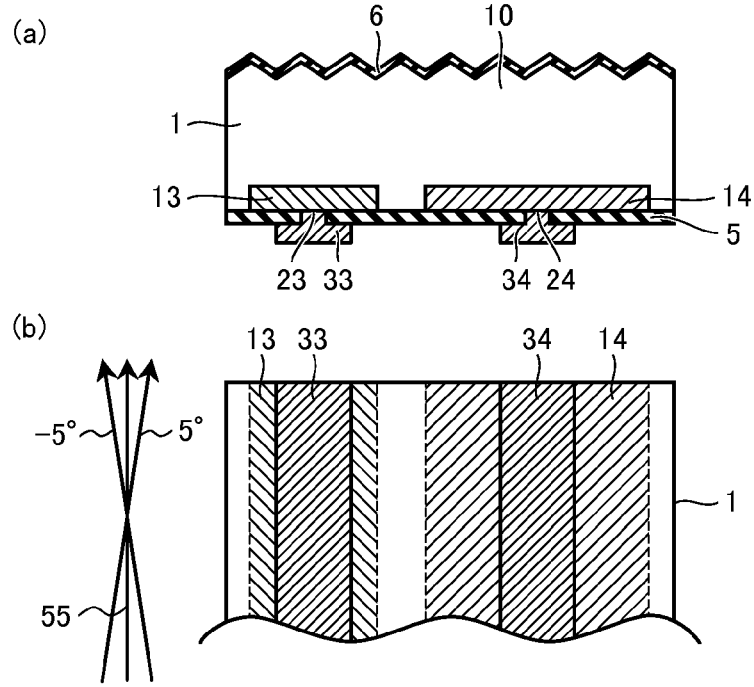
FIG. 16(a) is a schematic cross sectional view illustrating one example of the step of forming an electrode for n type and an electrode for p type.
FIG. 16(b) is a schematic plan view illustrating one example of the step of forming the electrode for n type and the electrode for p type.

Next, as shown in the schematic cross sectional view of FIG. 10(*a*) and the schematic plan view of FIG. 10(*b*), a p-type doping paste 4 is placed on a portion of the back surface of semiconductor substrate 1.

Here, as shown in the schematic plan view of FIG. 10(*b*), p-type doping paste 4 is placed to have a portion extending in a direction which forms an angle included in a range of −5° to +5° with the direction in which the abrasive grain marks (not shown) extend (i.e., direction indicated by arrow 55), as with n-type doping paste 3 described above.

As p-type doping paste 4, the one containing a p-type dopant such as a boron compound, and also containing, for example, a solvent, a thickener, and a silicon oxide precursor can be used. Further, as p-type doping paste 4, the one not containing a thickener can also be used.

As the boron compound, for example, a compound containing boron atoms such as boron oxide, boric acid, an organic boron compound, or a boron-aluminum compound can be used alone or in combination of two or more kinds thereof.

As the solvent, the same solvent as that in n-type doping paste 3 described above can be used.

As the thickener, the same thickener as that in n-type doping paste 3 described above can be used.

As the silicon oxide precursor, the same substance as that in n-type doping paste 3 described above can be used.

P-type doping paste 4 can be placed using the same technique as that for placing n-type doping paste 3 described above.

Thereafter, p-type doping paste 4 placed on the back surface of semiconductor substrate 1 is dried.

P-type doping paste 4 can be dried using the same technique as that for drying n-type doping paste 3 described above.

Next, as shown in the schematic cross sectional view of FIG. 11(a) and the schematic plan view of FIG. 11(b), semiconductor substrate 1 is put into the quartz furnace at more than or equal to 800° C. and less than or equal to 1100° C. to diffuse the p-type dopant from p-type doping paste 4 into the back surface of semiconductor substrate 1, to form a p-type dopant diffusion region 14. Thereby, as shown in the schematic plan view of FIG. 11(b), p-type dopant diffusion region 14 is formed in the shape of a band extending in a direction which forms an angle included in the range of −5° to +5° with the direction in which the abrasive grain marks extend (i.e., direction indicated by arrow 55).

Thereafter, a residue of p-type doping paste 4 on the back surface of silicon substrate 1 is removed. The residue of p-type doping paste 4 can be removed, for example, by immersing semiconductor substrate 1 having p-type doping paste 4 placed thereon in an aqueous solution of hydrofluoric acid, or the like.

Next, as shown in the schematic cross sectional view of FIG. 12(a) and the schematic plan view of FIG. 12(b), a passivation film 5 is formed on the back surface of semiconductor substrate 1. As passivation film 5, for example, a silicon nitride film, a silicon oxide film, a laminated film of a silicon nitride film and a silicon oxide film, or the like can be used. Passivation film 5 can be formed, for example, by a plasma CVD method or the like.

Next, as shown in the schematic cross sectional view of FIG. 13(a), a texture structure 10 is formed by texture-etching a light receiving surface of semiconductor substrate 1 which is on a side opposite to a side having passivation film 5 formed thereon. The texture-etching for forming texture structure 10 can be performed by using passivation film 5 formed on the other surface of semiconductor substrate 1 as an etching mask. When semiconductor substrate 1 is made of a silicon crystal substrate, the texture-etching can be performed by etching the light receiving surface of semiconductor substrate 1 with an etching solution prepared for example by adding isopropyl alcohol to an aqueous solution of alkali such as sodium hydroxide or potassium hydroxide and heating the solution to, for example, more than or equal to 70° and less than or equal to 80° C.

Next, as shown in the schematic cross sectional view of FIG. 14(a), a passivation film 6 is formed on the light receiving surface of semiconductor substrate 1. As passivation film 6, for example, a silicon nitride film, a silicon oxide film, a laminated film of a silicon nitride film and a silicon oxide film, or the like can be used. Passivation film 6 can be formed, for example, by the plasma CVD method or the like. Further, passivation film 6 on the light receiving surface of semiconductor substrate 1 is a film also serving as a so-called antireflection film.

Next, as shown in the schematic cross sectional view of FIG. 15(a) and the schematic plan view of FIG. 15(b), a contact hole 23 and a contact hole 24 are formed by removing portions of passivation film 5 on the back surface of semiconductor substrate 1 to expose a portion of n-type dopant diffusion region 13 from contact hole 23 and expose a portion of p-type dopant diffusion region 14 from contact hole 24.

Contact holes 23, 24 can be formed, for example, by a method of forming a resist pattern having openings at portions corresponding to positions where contact holes 23, 24 are to be formed, on passivation film 5 using a photolithographic technique, and thereafter removing passivation film 5 from the openings in the resist pattern by etching.

Next, as shown in the schematic cross sectional view of FIG. 16(a) and the schematic plan view of FIG. 16(b), an electrode for n type 33 electrically connected to n-type dopant diffusion region 13 through contact hole 23 is formed, and an electrode for p type 34 electrically connected to p-type dopant diffusion region 14 through contact hole 24 is formed. Here, as electrode for n type 33 and electrode for p type 34, for example, an electrode made of a metal such as silver can be used. Thus, the back electrode type solar cell in the present embodiment can be fabricated.

As described above, in the present embodiment, since n-type doping paste 3 and p-type doping paste 4 are each placed to have a portion extending in the direction which forms an angle included in the range of −5° to +5° with the direction in which the abrasive grain marks extend as described above, n-type doping paste 3 and p-type doping paste 4 can be each formed to have a stable shape, at least in that portion, in the direction which forms an angle included in the range of −5° to +5° with the direction in which the abrasive grain marks extend.

Thereby, in the present embodiment, n-type dopant diffusion region 13 and p-type dopant diffusion region 14 can also be each formed stably in a desired shape, and thus the back electrode type solar cell can have good characteristics stably.

It is noted that, although the above embodiment has described a semiconductor crystal ingot having an n-type conductivity type, the semiconductor crystal ingot may have a p-type conductivity type.

Figure 17:
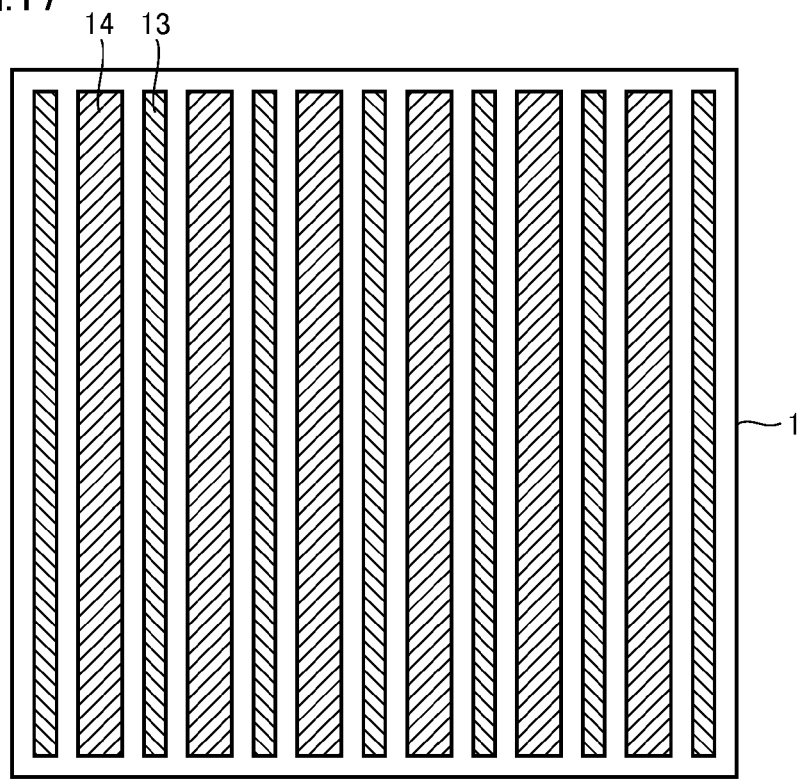
FIG. 17 is a schematic plan view of one example of the n-type dopant diffusion region and the p-type dopant diffusion region formed in the back surface of the semiconductor substrate.
Figure 18:
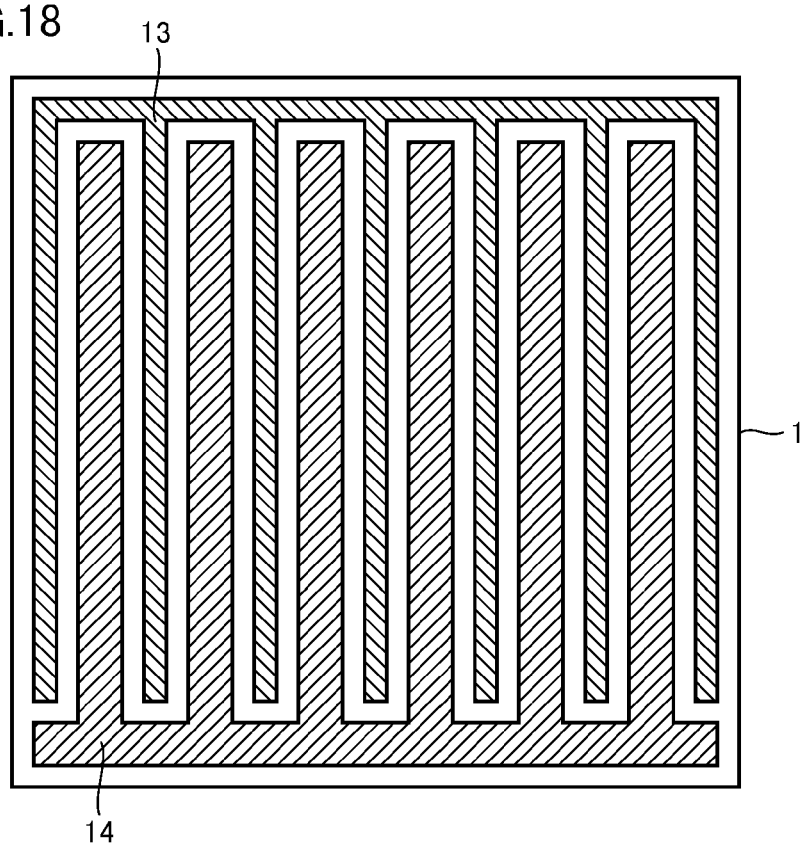
FIG. 18 is a schematic plan view of another example of the n-type dopant diffusion region and the p-type dopant diffusion region formed in the back surface of the semiconductor substrate.
Figure 19:
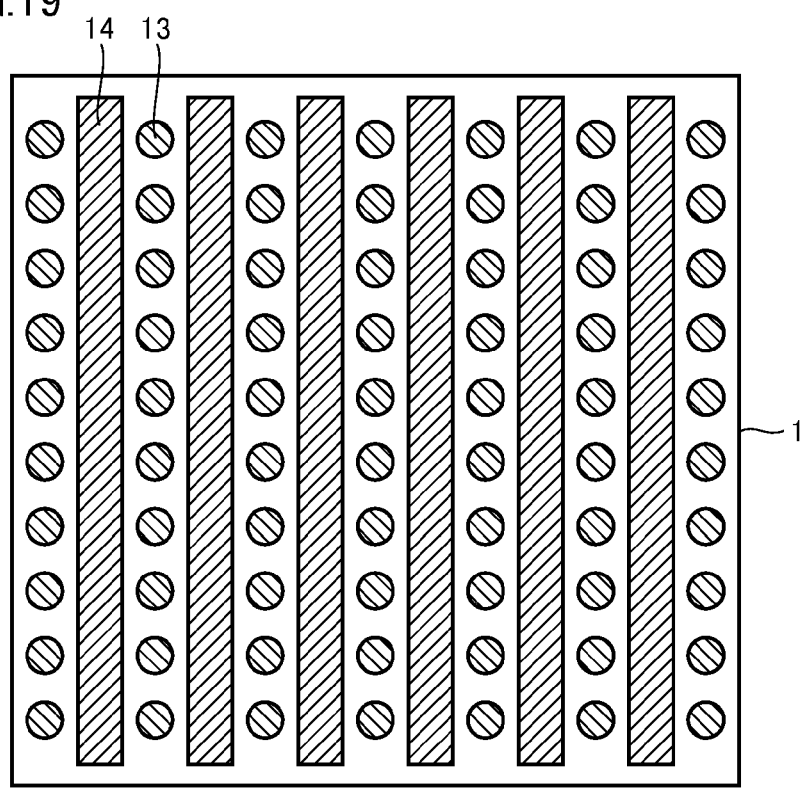
FIG. 19 is a schematic plan view of another example of the n-type dopant diffusion region and the p-type dopant diffusion region formed in the back surface of the semiconductor substrate.

Further, n-type dopant diffusion region 13 and p-type dopant diffusion region 14 may each have a shape extending in one direction, as shown in the schematic plan view of FIG. 17. Alternatively, a portion of at least one of n-type dopant diffusion region 13 and p-type dopant diffusion region 14 may be perpendicular to the direction in which the abrasive grain marks extend, as shown in the schematic plan view of FIG. 18. Alternatively, only either n-type dopant diffusion region 13 or p-type dopant diffusion region 14 may have a shape extending in one direction, as shown in the schematic plan view of FIG. 19.

Furthermore, the present invention is not limited to a back electrode type solar cell, and is also applicable to semiconductor devices including a solar cell of any configuration such as a bifacial electrode type solar cell manufactured by forming electrodes on both a light receiving surface and a back surface of a semiconductor substrate.

EXAMPLE

<Placement of Doping Paste>

Figure 20:
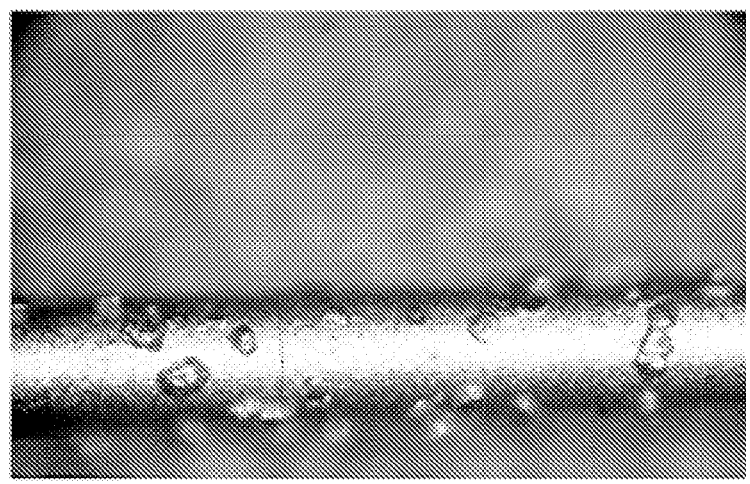
FIG. 20 is an enlarged photograph of a wire saw used in an Example.

First, an n-type single crystal silicon ingot was pressed against a reciprocating wire saw (having a shape shown in the enlarged photograph of FIG. 20) and cut. Thereby, a plurality of n-type single crystal silicon substrates each having a thickness of 200 μm were formed, in which abrasive grain marks in the shape of grooves extending in one direction were formed in a light receiving surface and a back surface in the shape of a quasi square with each side having a length of 126 mm. The wire saw shown in FIG. 20 used herein was fabricated by bonding diamond abrasive grains having a grain size of less than or equal to 30 μm, on an outer peripheral surface of a piano wire having a cross sectional diameter of 120 μm, with nickel plated thereon.

Figure 21:
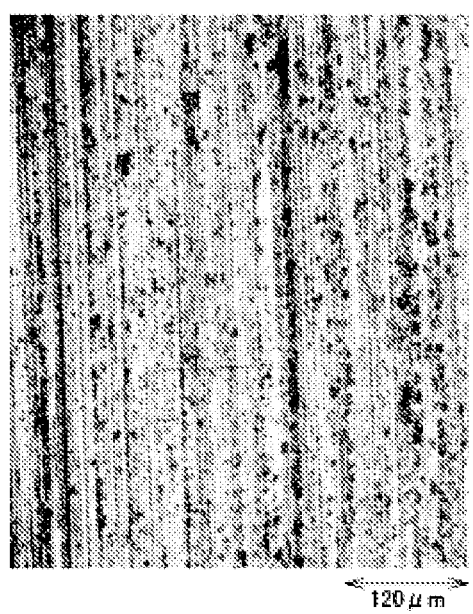
FIG. 21 is a microscope photograph of one example of a surface of an n-type single crystal silicon substrate cut with the wire saw shown in FIG. 20.
Figure 22:
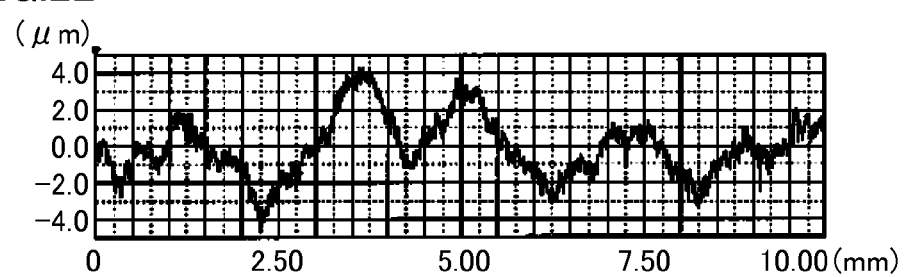
FIG. 22 is a view showing the result of measuring irregularities of the surface of the n-type single crystal silicon substrate shown in FIG. 21 with a laser microscope.

FIG. 21 shows a microscope photograph of one example of a surface of an n-type single crystal silicon substrate cut with the wire saw described above, and FIG. 22 shows the result of measuring irregularities of the surface of the n-type single crystal silicon substrate shown in FIG. 21 with a laser microscope. It is noted that the axis of abscissas in FIG. 22 represents the width of the surface of the n-type single crystal silicon substrate (maximum width: 10 mm), and the axis of ordinates in FIG. 22 represents irregularities of the surface of the n-type single crystal silicon substrate caused by a saw mark and abrasive grain marks resulting from cutting with the wire saw.

Figure 23:
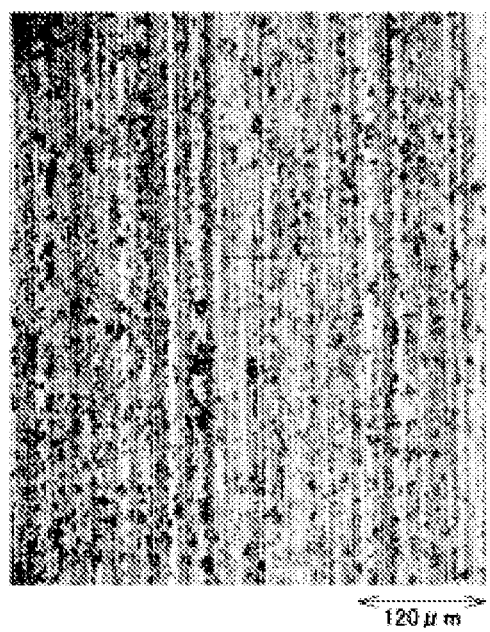
FIG. 23 is a microscope photograph of another example of the surface of the n-type single crystal silicon substrate cut with the wire saw shown in FIG. 22.
Figure 24:
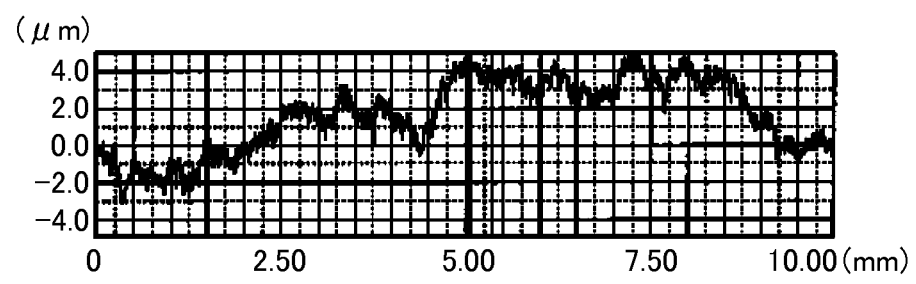
FIG. 24 is a view showing the result of measuring irregularities of the surface of the n-type single crystal silicon substrate shown in FIG. 23 with a laser microscope.

FIG. 23 shows a microscope photograph of another example of the surface of the n-type single crystal silicon substrate cut with the wire saw described above, and FIG. 24 shows the result of measuring irregularities of the surface of the n-type single crystal silicon substrate shown in FIG. 23 with a laser microscope. It is noted that the axis of abscissas in FIG. 24 represents the width of the surface of the n-type single crystal silicon substrate (maximum width: 10 mm), and the axis of ordinates in FIG. 24 represents irregularities of the surface of the n-type single crystal silicon substrate caused by a saw mark and abrasive grain marks resulting from cutting with the wire saw.

It was confirmed that, as shown in FIGS. 21 to 24, a saw mark as a large wave formed along a direction in which the n-type single crystal silicon ingot was pressed against the wire saw, and abrasive grain marks in the shape of grooves formed in the saw mark along a traveling direction of the wire saw (vertical lines in FIGS. 21 and 23) were formed in the surface of the n-type single crystal silicon substrate.

Next, slice damage in the surface of the n-type single crystal silicon substrate was removed by etching the surface of the n-type single crystal silicon substrate formed as described above, to a depth of 30 μm, with an aqueous solution of sodium hydroxide having a sodium hydroxide concentration of 48% by mass (i.e., 48 g of sodium hydroxide with respect to 52 g of water).

Figure 25:
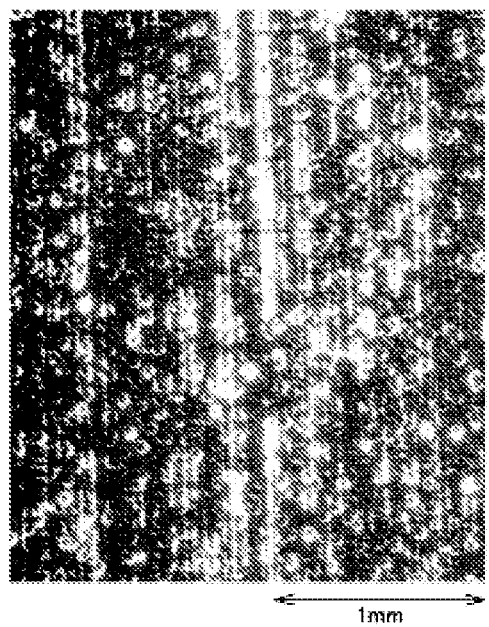
FIG. 25 is a microscope photograph of one example of the surface of the n-type single crystal silicon substrate shown in FIG. 21 subjected to etching.
Figure 26:
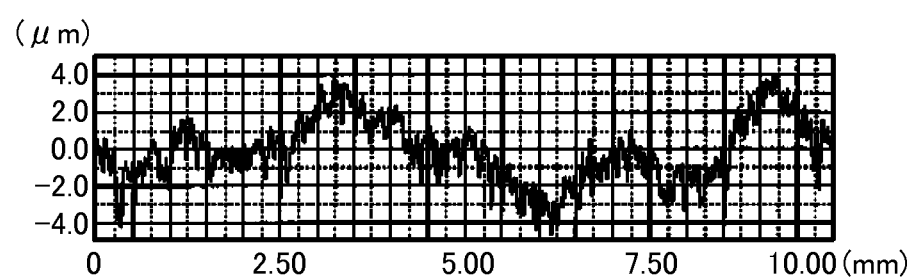
FIG. 26 is a view showing the result of measuring irregularities of the surface of the n-type single crystal silicon substrate shown in FIG. 25 with a laser microscope.
Figure 27:
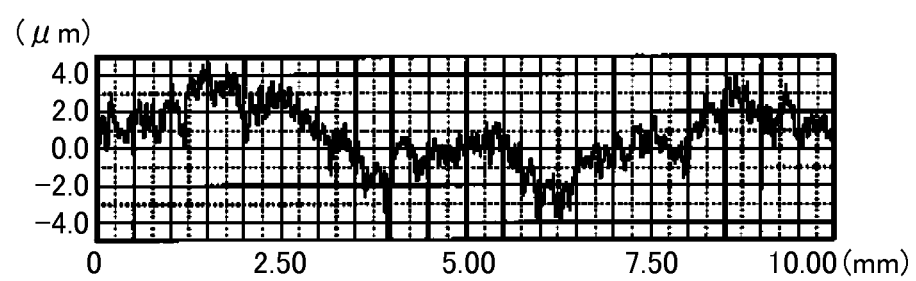
FIG. 27 is a view showing the result of measuring irregularities of the surface of the n-type single crystal silicon substrate shown in FIG. 25 subjected to etching with a laser microscope.

FIG. 25 shows a microscope photograph of one example of the surface of the n-type single crystal silicon substrate shown in FIG. 21 subjected to etching, and FIG. 26 shows the result of measuring irregularities of the surface of the n-type single crystal silicon substrate shown in FIG. 25 with a laser microscope. FIG. 27 shows the result of measuring irregularities of the surface of the n-type single crystal silicon substrate shown in FIG. 25 subjected to etching with a laser microscope. Although circular depressions were formed in the surface of the n-type single crystal silicon substrate as shown in FIG. 25, the abrasive grain marks did not disappear from the surface of the n-type single crystal silicon substrate as shown in FIGS. 26 and 27.

Next, on the surface of the n-type single crystal silicon substrate subjected to etching described above, an n-type doping paste in the shape of a plurality of bands (design width of one band of the n-type doping paste: 300 μm, viscosity: 30 Pa·s) was placed intermittently at an interval of 1.5 mm to extend in a direction which formed an angle included in a range of −5° to +5° with a direction in which the abrasive grain marks extended.

Figure 28:
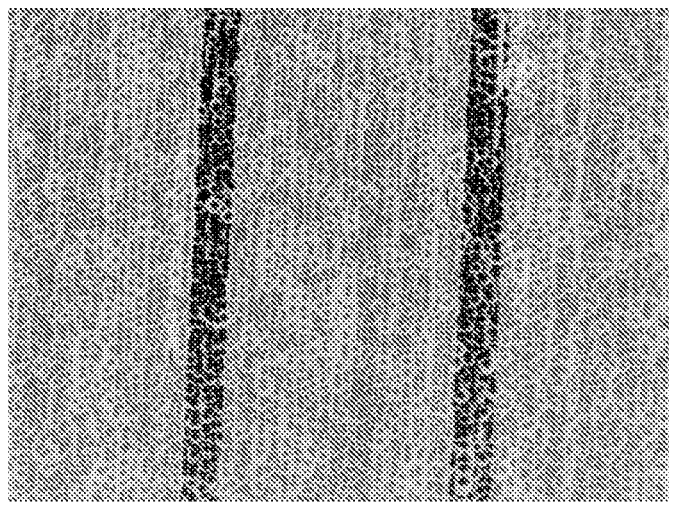
FIG. 28(a) is a microscope photograph of the surface of the n-type single crystal silicon substrate on which the n-type doping paste is placed to extend in a direction which forms an angle included in a range of −5° to +5° with a direction in which abrasive grain marks extend.
FIG. 28(b) is an enlarged photograph of the microscope photograph of FIG. 28(a).
Figure 28:
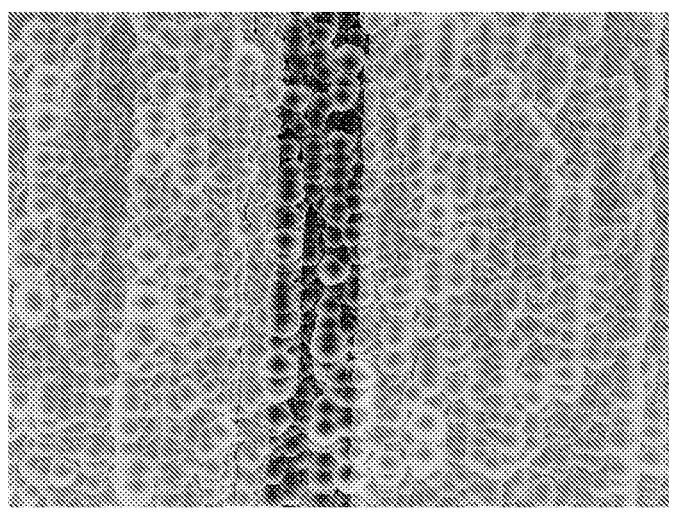

FIG. 28(*a*) shows a microscope photograph of the surface of the n-type single crystal silicon substrate on which the n-type doping paste is placed to extend in the direction which forms an angle included in the range of −5° to +5° with the direction in which the abrasive grain marks extend, and FIG. 28(*b*) shows an enlarged photograph of the microscope photograph of FIG. 28(*a*). In FIGS. 28(*a*) and 28(*b*), a dark-colored portion is where the n-type doping paste is placed, and a light-colored portion indicates an opening.

It was confirmed that, as shown in FIGS. 28(*a*) and 28(*b*), when the n-type doping paste was placed to extend in the direction which formed an angle included in the range of −5° to +5° with the direction in which the abrasive grain marks extended, the n-type doping paste was able to be suppressed from flowing out in a direction other than the direction in which the n-type doping paste extended.

As a Comparative Example, the n-type doping paste was placed as described above, except for placing the n-type doping paste in the shape of a plurality of bands to extend in a direction perpendicular to the direction in which the abrasive grain marks extended.

Figure 29:
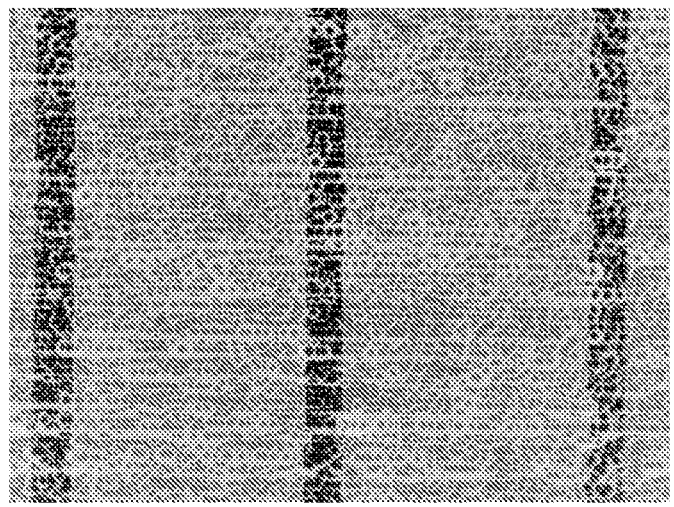
FIG. 29(a) is a microscope photograph of the surface of the n-type single crystal silicon substrate on which the n-type doping paste is placed to extend in a direction perpendicular to the direction in which the abrasive grain marks extend.
FIG. 29(b) is an enlarged photograph of the microscope photograph of FIG. 29(a).
Figure 29:
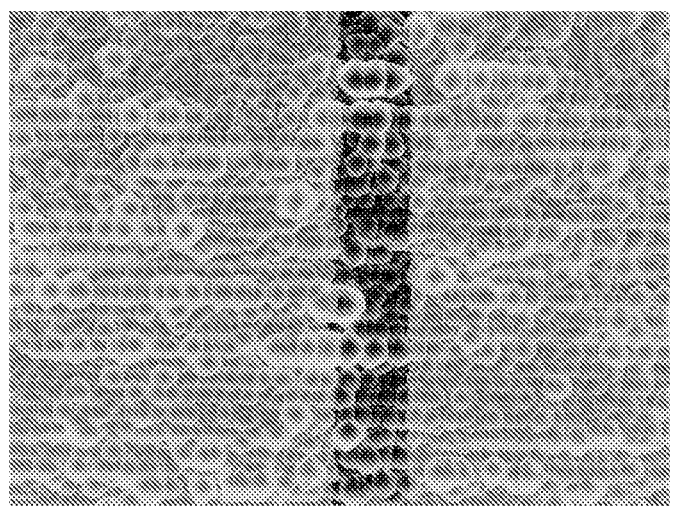
Figure 30:
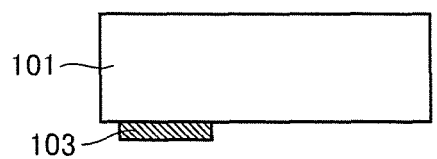
FIGS. 30(a) to 30(i) are schematic cross sectional views illustrating one example of a method for manufacturing a conventional back electrode type solar cell.
Figure 30:
Figure 30:
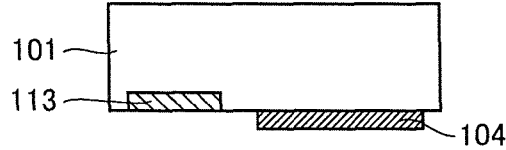
Figure 30:
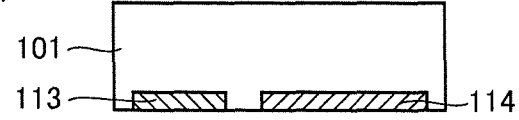
Figure 30:
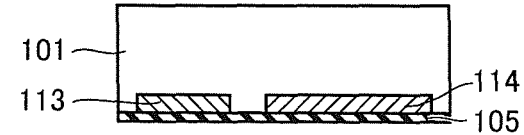
Figure 30:
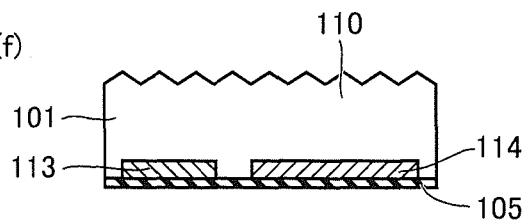
Figure 30:
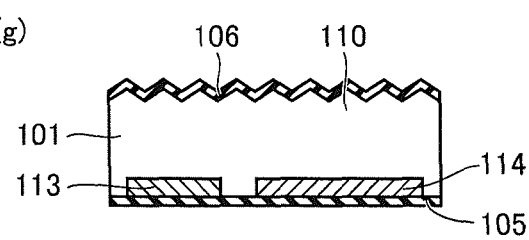
Figure 30:
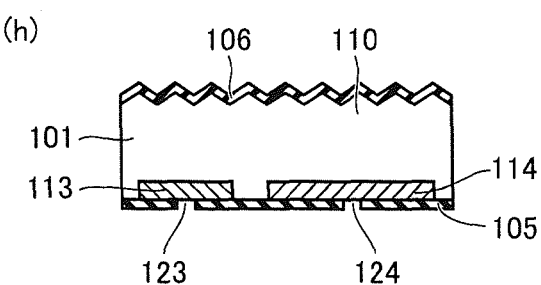
Figure 30:
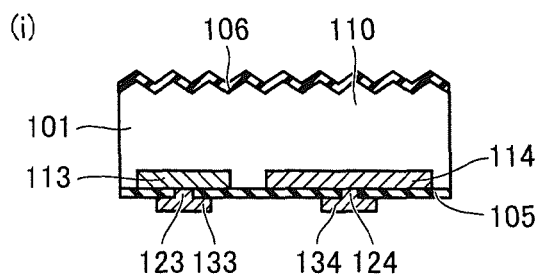

FIG. 29(*a*) shows a microscope photograph of the surface of the n-type single crystal silicon substrate on which the n-type doping paste is placed to extend in the direction perpendicular to the direction in which the abrasive grain marks extend, and FIG. 29(*b*) shows an enlarged photograph of the microscope photograph of FIG. 29(*a*). In FIGS. 29(*a*) and 29(*b*), a dark-colored portion is where the n-type doping paste is placed, and a light-colored portion indicates an opening.

It was confirmed that, as shown in FIGS. 29(*a*) and 29(*b*), when the n-type doping paste was placed to extend in the direction perpendicular to the direction in which the abrasive grain marks extended, the n-type doping paste flew out in a direction other than the direction in which the n-type doping paste extended, and had a varied width, when compared with the case where the n-type doping paste was placed to extend in the direction which formed an angle included in the range of −5° to +5° with the direction in which the abrasive grain marks extended.

Further, from the surface of the n-type single crystal silicon substrate on which the n-type doping paste was placed to extend in the direction which formed an angle included in the range of −5° to +5° with the direction in which the abrasive grain marks extended, any 10 n-type doping paste-placed portions (sample Nos. 1 to 10) were selected, the maximum value and the minimum value of the width of each of these 10 n-type doping paste-placed portions were measured, and the difference between the maximum value and the minimum value was calculated. Then, an average value and a standard deviation σ were calculated for each of the maximum values, the minimum values, and the differences between the maximum values and the minimum values, of the widths of the n-type doping paste-placed portions of sample Nos. 1 to 10. Table 1 shows results thereof.

TABLE 1

| Sample No. | Maximum Width | Minimum Width | Maximum Width − Minimum Width |
|---|---|---|---|
| 1 | 333 | 292 | 41 |
| 2 | 356 | 303 | 53 |
| 3 | 320 | 289 | 31 |
| 4 | 344 | 295 | 49 |
| 5 | 306 | 280 | 26 |
| 6 | 328 | 291 | 37 |
| 7 | 317 | 275 | 42 |
| 8 | 321 | 290 | 31 |
| 9 | 332 | 292 | 40 |
| 10 | 310 | 298 | 12 |
| Average Value | 327 | 291 | 36 |
| σ | 15 | 8 | 12 |

(n-type doping paste applied vertically*1)
*1 the n-type doping paste was placed to extend in the direction which formed an angle included in the range of −5° to +5° with the direction in which the abrasive grain marks extended
(unit: μm)

As shown in Table 1, for the maximum values, the minimum values, and the differences between the maximum values and the minimum values of the widths of the n-type doping paste-placed portions of sample Nos. 1 to 10, the average values were 327, 291, and 36, respectively, and standard deviations σ were 15, 8, and 12, respectively.

In contrast, from the surface of the n-type single crystal silicon substrate on which the n-type doping paste was placed to extend in the direction perpendicular to the direction in which the abrasive grain marks extended, any 10 n-type doping paste-placed portions were selected, the maximum value and the minimum value of the width of each of these 10 n-type doping paste-placed portions (sample Nos. 11 to 20) were measured, and the difference between the maximum value and the minimum value was calculated. Then, an average value and standard deviation σ were calculated for each of the maximum values, the minimum values, and the differences between the maximum values and the minimum values, of the widths of the n-type doping paste-placed portions of sample Nos. 11 to 20. Table 2 shows results thereof.

TABLE 2

| Sample No. | Maximum Width | Minimum Width | Maximum Width − Minimum Width |
|---|---|---|---|
| 11 | 381 | 300 | 81 |
| 12 | 356 | 288 | 68 |
| 13 | 375 | 293 | 82 |
| 14 | 374 | 290 | 84 |
| 15 | 396 | 275 | 121 |
| 16 | 428 | 305 | 123 |
| 17 | 396 | 292 | 104 |
| 18 | 361 | 292 | 69 |
| 19 | 388 | 294 | 94 |
| 20 | 403 | 303 | 100 |
| Average Value | 386 | 293 | 93 |
| σ | 21 | 9 | 19 |

(n-type doping paste applied laterally*2)
*2 the doping paste was placed to extend in the direction perpendicular to the direction in which the abrasive grain marks extended
(unit: μm)

As shown in Table 2, for the maximum values, the minimum values, and the differences between the maximum values and the minimum values of the widths of the n-type doping paste-placed portions of sample Nos. 11 to 20, the average values were 386, 293, 93, respectively, and standard deviations σ were 21, 9, and 19, respectively.

Similarly, for a p-type doping paste, comparison was made between a case where the p-type doping paste was placed to extend in a direction which formed an angle included in a range of −5° to +5° with the direction in which the abrasive grain marks extended and a case where the p-type doping paste was placed to extend in a direction perpendicular to the direction in which the abrasive grain marks extended. The p-type doping paste in the shape of a plurality of bands was placed on the surface of the silicon substrate, intermittently at an interval of 1.5 mm (design width of one band of the p-type doping paste: 1000 μm, viscosity: 30 Pa·s)

As with the n-type doping paste, from the surface of the n-type single crystal silicon substrate on which the p-type doping paste was placed to extend in the direction which formed an angle included in the range of −5° to +5° with the direction in which the abrasive grain marks extended, any 10 p-type doping paste-placed portions (sample Nos. 21 to 30) were selected, the maximum value and the minimum value of the width of each of these 10 p-type doping paste-placed portions were measured, and the difference between the maximum value and the minimum value was calculated. Table 3 shows results thereof.

Further, as the Comparative Example, from the surface of the n-type single crystal silicon substrate on which the p-type doping paste was placed to extend in a direction perpendicular to the direction in which the abrasive grain marks extended, any 10 p-type doping paste-placed portions were selected, the maximum value and the minimum value of the width of each of these 10 p-type doping paste-placed portions (sample Nos. 31 to 40) were measured, and the difference between the maximum value and the minimum value was calculated. Table 4 shows results thereof.

Furthermore, an average value and standard deviation σ were calculated for each of the maximum values, the minimum values, and the differences between the maximum values, and the minimum values, of the widths of the p-type doping paste-placed portions of sample Nos. 21 to 30 and sample Nos. 31 to 40. Tables 3 and 4 show results thereof.

TABLE 3

| Sample No. | Maximum Width | Minimum Width | Maximum Width − Minimum Width |
| --- | --- | --- | --- |
| 21 | 1028 | 980 | 48 |
| 22 | 1009 | 967 | 42 |
| 23 | 1036 | 992 | 44 |
| 24 | 1020 | 970 | 50 |
| 25 | 1036 | 985 | 51 |
| 26 | 1031 | 992 | 39 |
| 27 | 1042 | 1001 | 41 |
| 28 | 1015 | 979 | 36 |
| 29 | 1029 | 977 | 52 |
| 30 | 1045 | 995 | 50 |
| Average Value | 1029 | 974 | 45 |
| σ | 12 | 11 | 6 |

(p-type doping paste applied vertically*1)
*1 the p-type doping paste was placed to extend in the direction which formed an angle included in the range of −5° to +5° with the direction in which the abrasive grain marks extended
(unit: μm)

TABLE 4

| Sample No. | Maximum Width | Minimum Width | Maximum Width − Minimum Width |
| --- | --- | --- | --- |
| 31 | 1088 | 977 | 111 |
| 32 | 1112 | 989 | 123 |
| 33 | 1140 | 991 | 149 |
| 34 | 1095 | 964 | 131 |
| 35 | 1124 | 997 | 127 |
| 36 | 1108 | 993 | 115 |
| 37 | 1099 | 981 | 118 |
| 38 | 1131 | 993 | 138 |
| 39 | 1154 | 1005 | 149 |
| 40 | 1129 | 980 | 149 |
| Average Value | 1118 | 987 | 131 |
| σ | 21 | 12 | 15 |

(p-type doping paste applied laterally*2)
*2 the doping paste was placed to extend in the direction perpendicular to the direction in which the abrasive grain marks extended
(unit: μm)

As shown in Table 3, for the maximum values, the minimum values, and the differences between the maximum values and the minimum values of the widths of the p-type doping paste-placed portions of sample Nos. 21 to 30, the average values were 1029, 974, and 45, respectively, and standard deviations σ were 12, 11, and 6, respectively.

Further, as shown in Table 4, for the maximum values, the minimum values, and the differences between the maximum values and the minimum values of the widths of the p-type doping paste-placed portions of sample Nos. 31 to 40, the average values were 1118, 987, and 131, respectively, and standard deviations σ were 21, 12, and 15, respectively.

As described above, it was confirmed that, as shown in Tables 1 to 4, deviation of the width of the n-type doping paste from a designed value can be suppressed when the doping paste is placed to extend in the direction which forms an angle included in the range of −5° to +5° with the direction in which the abrasive grain marks extend, when compared with the case where the doping paste is placed to extend in the direction perpendicular to the direction in which the abrasive grain marks extend.

<Fabrication and Evaluation of Back Electrode Type Solar Cell>

Back electrode type solar cells were fabricated, respectively using an n-type single crystal silicon substrate having n-type doping paste-placed portions of sample Nos. 1 to 10 and p-type doping paste-placed portions of sample Nos. 21 to 30 (i.e., a substrate of the Example), and an n-type single crystal silicon substrate having n-type doping paste-placed portions of sample Nos. 11 to 20 and p-type doping paste-placed portions of sample Nos. 31 to 40 (i.e., a substrate of the Comparative Example).

Specifically, first, an n-type doping paste was placed on each of the substrates of the Example and the Comparative Example thermally oxidized in a quartz furnace at 900° C. for 20 minutes in an oxygen atmosphere. Thereafter, each of the substrates of the Example and the Comparative Example was placed inside an oven and heated at 200° C. for 30 minutes to dry the n-type doping paste.

Next, each of the substrates of the Example and the Comparative Example was heated in the quartz furnace at 950° C. for 30 minutes, and thereby phosphorus was diffused at the n-type doping paste-placed portions in each of the substrates of the Example and the Comparative Example to form n-type dopant diffusion regions.

Next, each of the substrates of the Example and the Comparative Example was immersed in an aqueous solution of hydrofluoric acid, thereby removing all of the residue of the n-type doping paste on each of the substrates of the Example and the Comparative Example.

Next, a p-type doping paste was placed between the n-type dopant diffusion regions formed in each of the substrates of the Example and the Comparative Example thermally oxidized in the quartz furnace at 900° C. for 20 minutes in an oxygen atmosphere. Thereafter, each of the substrates of the Example and the Comparative Example was placed inside the oven and heated at 200° C. for 30 minutes to dry the p-type doping paste.

Next, each of the substrates of the Example and the Comparative Example was heated in the quartz furnace at 1000° C. for 30 minutes, and thereby boron was diffused at the p-type doping paste-placed portions in each of the substrates of the Example and the Comparative Example to form p-type dopant diffusion regions.

Next, each of the substrates of the Example and the Comparative Example was immersed in an aqueous solution of hydrofluoric acid, thereby removing all of the residue of the p-type doping paste on each of the substrates of the Example and the Comparative Example.

Next, a passivation film made of a silicon nitride film was formed by the plasma CVD method over the entire surface of each of the substrates of the Example and the Comparative Example on a side where the n-type dopant diffusion regions and the p-type dopant diffusion regions were formed.

Next, a texture structure was formed by texture-etching a surface of each of the substrates of the Example and the Comparative Example on a side opposite to the side having the passivation film formed thereon. Here, the texture-etching was performed using an etching solution at 70° C. to 80° C. prepared by adding isopropyl alcohol to an aqueous solution of sodium hydroxide having a sodium hydroxide concentration of 3% by mass.

Next, an antireflection film made of a silicon nitride film was formed by the plasma CVD method on the texture structure of each of the substrates of the Example and the Comparative Example.

Next, contact holes were formed by removing portions of the passivation film on each of the substrates of the Example and the Comparative Example in the shape of bands to expose a portion of each of the n-type dopant diffusion regions and the p-type dopant diffusion regions.

Thereafter, a commercially available silver paste was applied to fill the contact holes in each of the substrates of the Example and the Comparative Example, was dried, and fired by being heated at 600° C. for 20 minutes, to form silver electrodes in contact with the n-type dopant diffusion regions and the p-type dopant diffusion regions, respectively. Thereby, the back electrode type solar cells respectively using the substrates of the Example and the Comparative Example were fabricated.

Subsequently, each of the back electrode type solar cell fabricated using the substrate of the Example (i.e., solar cell of the Example) and the back electrode type solar cell fabricated using the substrate of the Comparative Example (i.e., solar cell of the Comparative Example) was irradiated with quasi solar light using a solar simulator, and current-voltage (IV) characteristics were measured, and short circuit current density, open voltage, F.F (Fill Factor), conversion efficiency, and leak current were measured. Table 5 shows results thereof. It is noted that, in Table 5, values of the short circuit current density, open voltage, F.F, conversion efficiency, and leak current of the solar cell of the Example are expressed as relative values obtained when values of the short circuit current density, open voltage, F.F, conversion efficiency, and leak current of the solar cell of the Comparative Example are each set to 100.

TABLE 5

|  | Short Circuit Current Density | Open Voltage | F. F | Conversion Efficiency | Leak Current |
|---|---|---|---|---|---|
| Example | 104 | 101 | 109 | 115 | 9 |
| Comparative Example | 100 | 100 | 100 | 100 | 100 |

It was confirmed that, as shown in Table 5, the solar cell of the Example has higher short circuit current density, open voltage, F.F, conversion efficiency, and lower leak current, when compared with the solar cell of the Comparative Example. Therefore, the solar cell of the Example can stably obtain good characteristics, when compared with the solar cell of the Comparative Example.

This is considered to be because, since the n-type dopant diffusion regions and the p-type dopant diffusion regions can be stably formed in the shape of bands extending in the direction which forms an angle included in the range of −5° to +5° with the direction in which the abrasive grain marks extend in the solar cell of the Example, each of the n-type dopant diffusion regions and the p-type dopant diffusion regions has less variation in width, when compared with the solar cell of the Comparative Example.

It should be understood that the embodiment and the example disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is applicable to a semiconductor device and a method for manufacturing a semiconductor device, and in particular suitably applicable to a back electrode type solar cell and a method for manufacturing a back electrode type solar cell.

REFERENCE SIGNS LIST

1: semiconductor substrate; 1a: slice damage; 3: n-type doping paste; 4: p-type doping paste; 5: passivation film; 10: texture structure; 6: passivation film; 13: n-type dopant diffusion region; 14: p-type dopant diffusion region; 23, 24: contact hole; 33: electrode for n type; 34: electrode for p type; 50: semiconductor crystal ingot; 51, 52: guide roller; 53: wire saw; 53a: core wire; 53b: abrasive grains; 54, 55: arrow; 61: saw mark; 62: abrasive grain marks; 101: silicon substrate; 103: n-type doping paste; 104: p-type doping paste; 105: silicon oxide film; 106: light receiving surface passivation film; 110: texture structure; 113: n-type dopant diffusion region; 114: p-type dopant diffusion region; 123, 124: contact hole; 133: electrode for n type; 134: electrode for p type.

The invention claimed is:
1. A semiconductor device, comprising:
a semiconductor substrate; and
a dopant diffusion region comprising one surface of said semiconductor substrate, wherein
abrasive grain marks are formed in said surface of said semiconductor substrate,
said dopant diffusion region comprises a portion extending in a direction which forms an angle included in a range of −5° to +5° with a direction in which said abrasive grain marks extend, and said dopant diffusion region is formed by diffusing a dopant from a doping paste placed on the one surface of said semiconductor substrate.

2. The semiconductor device according to claim 1, wherein said dopant diffusion region comprises at least one of an n-type dopant diffusion region and a p-type dopant diffusion region, and the semiconductor device further comprises:
- an electrode for n type provided on said n-type dopant diffusion region; and
- an electrode for p type provided on said p-type dopant diffusion region.

3. A method for manufacturing a semiconductor device, comprising the steps of:
- forming abrasive grain marks extending in one direction in a surface of a semiconductor substrate;
- placing a doping paste comprising a portion extending in a direction which forms an angle included in a range of −5° to +5° with a direction in which said abrasive grain marks extend, on a portion of said surface of said semiconductor substrate; and
- forming a dopant diffusion region from a dopant in said doping paste on said semiconductor substrate.

4. The method for manufacturing a semiconductor device according to claim 3, wherein forming the abrasive grain marks includes cutting a semiconductor crystal ingot with a wire saw.

5. The method for manufacturing a semiconductor device according to claim 3, further comprising etching said surface of said semiconductor substrate between said forming the abrasive grain marks and said placing the doping paste.

* * * * *